US006555250B2

(12) United States Patent
Shah et al.

(10) Patent No.: US 6,555,250 B2
(45) Date of Patent: Apr. 29, 2003

(54) NI-PLATED TARGET DIFFUSION BONDED TO A BACKING PLATE AND METHOD OF MAKING SAME

(75) Inventors: Ritesh P. Shah, Liberty Lake, WA (US); David E. Steele, Spokane, WA (US); William R. Turner, Spokane, WA (US); Anthony F. Beier, Spokane, WA (US); Janine K. Kardokus, Otis Orchards, WA (US); Susan D. Strothers, Spokane, WA (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/311,190

(22) Filed: May 12, 1999

(65) Prior Publication Data

US 2002/0003010 A1 Jan. 10, 2002

Related U.S. Application Data

(62) Division of application No. 09/031,247, filed on Feb. 26, 1998, now abandoned.
(60) Provisional application No. 60/041,402, filed on Mar. 19, 1997.

(51) Int. Cl.$^7$ ........................... C23C 14/34; B32B 15/01
(52) U.S. Cl. ..................... 428/652; 428/660; 428/675; 428/680; 204/298.13; 148/535
(58) Field of Search ................................ 148/518, 527, 148/535, 902; 428/652, 660, 675, 680; 204/298.13

(56) References Cited

U.S. PATENT DOCUMENTS

| 4,066,381 A | 1/1978 | Ohta |
| 4,194,672 A | 3/1980 | Uto et al. ................. 228/194 |
| 4,468,313 A | 8/1984 | Okamura |
| 4,610,774 A | 9/1986 | Sakata |
| 4,752,335 A | 6/1988 | Korb |
| 4,820,397 A | 4/1989 | Fielder |
| 4,826,584 A | 5/1989 | dos Santos Pereiro Ribeiro |
| 4,838,935 A | 6/1989 | Dunlop |
| 4,889,772 A | 12/1989 | Bergmann |
| 4,961,831 A | 10/1990 | Bergmann et al. |

(List continued on next page.)

FOREIGN PATENT DOCUMENTS

| EP | 0-370211 | | 5/1990 |
| EP | 0590904 A1 | | 9/1993 |
| JP | 63-20154 A | * | 1/1988 |
| JP | 63-157102 | | 6/1988 |
| JP | 63-270459 | | 8/1988 |
| JP | 01-47683 A | * | 2/1989 |
| JP | 01-47863 A | * | 2/1989 |
| JP | 1-283367 | | 11/1989 |
| JP | 1-301855 | | 12/1989 |
| JP | 6-158296 | | 6/1994 |
| JP | 7-278804 | | 10/1995 |
| WO | 98/26107 | * | 6/1998 |

OTHER PUBLICATIONS

*ASM Handbook,* vol. 2 Properties and Selection, pp. 15–27, 223, 234, 235, ASM International, 1990.*
*Advanced Materials and Processes,* vol. 156, No. 6, Dec. 1999, p. 100.*
U.S. patent application Ser. No. 09/125,906, Beier, et al., filed Aug. 12, 1998.

*Primary Examiner*—George Wyszomierski
(74) *Attorney, Agent, or Firm*—Wells St. John P.S.

(57) ABSTRACT

The invention includes a method of forming a heat treated sputtering target assembly. A backing plate is diffusion bonded to a sputtering target to produce a sputtering target assembly. The sputtering target assembly is heat treated to precipitation harden the backing plate of the assembly. The heat treatment includes heating and quenching, with the quenching being performed by immersing the backing plate in a quenchant without submerging the sputtering target.

11 Claims, 2 Drawing Sheets

U.S. PATENT DOCUMENTS

| | | |
|---|---|---|
| 4,961,832 A | 10/1990 | Shagun |
| 4,963,239 A | 10/1990 | Shimamura |
| 4,963,240 A | 10/1990 | Fukasawa |
| 4,964,962 A | 10/1990 | Nobutani |
| 4,964,968 A | 10/1990 | Arita |
| 4,964,969 A | 10/1990 | Kusakabe |
| 4,966,676 A | 10/1990 | Fukasawa |
| 4,966,677 A | 10/1990 | Aichert et al. |
| 4,971,674 A | 11/1990 | Hata |
| 5,032,468 A | 7/1991 | Dumont |
| 5,230,459 A | 7/1993 | Mueller et al. .............. 228/164 |
| 5,342,496 A | 8/1994 | Stellrecht |
| 5,397,050 A | 3/1995 | Mueller |
| 5,487,822 A | 1/1996 | Demaray et al. ...... 204/298.09 |
| 5,693,203 A * | 12/1997 | Ohhashi et al. ........ 204/298.12 |
| 5,732,312 A | 3/1998 | Kennedy |

\* cited by examiner

RAM TENSILE TEST DATA

NI-PLATED TARGET DIFFUSION BONDED TO A BACKING PLATE AND METHOD OF MAKING SAME

RELATED APPLICATIONS

This application is a division of patent application Ser. No. 09/031,247; filed Feb. 26, 1998, now abandoned which claims the benefit of U.S. Provisional Application No. 60/041,402, filed Mar. 19, 1997.

BACKGROUND OF THE INVENTION

The present invention relates to a sputtering target assembly having a precipitation hardened backing plate diffusion bonded to a sputtering target.

There has been growing interest in sputtering target assemblies with increasingly thin sputtering targets to reduce costs and, in some cases, accommodate the sputtering target assembly in certain sputtering chambers. In such applications, sputtering target assemblies of less than about one inch total thickness may be required. However, with such sputtering target assemblies, the strength of the backing plate may be exceeded under the conditions encountered in the sputtering chamber, which may include high water pressure on one side for cooling and high vacuum on the other side during the sputtering process. Thermal cycling and pressure resulting from circulating coolant exerted upon the backside of the target assembly with simultaneous vacuum conditions on the front face of the target can result in elastic and plastic deformation of the target backing plate assembly.

Although sputtering target assemblies may be made by solder bonding backing plates of various materials to a target, solder bonding has the disadvantage of not being able to withstand high power sputtering applications. Thus, diffusion bonded sputtering target assemblies are preferred.

The present invention provides a method of making a sputtering target assembly with a high strength backing plate diffusion bonded to a sputtering target that can withstand the stresses and strains typically encountered in sputtering chambers.

SUMMARY OF THE INVENTION

According to the invention there is provided a method of making a heat treated sputtering target assembly that comprises providing a sputtering target and a heat treatable, precipitation hardenable backing plate diffusion bonded to the sputtering target wherein the diffusion bonded sputtering target assembly is heat treated to precipitation harden the backing plate without delaminating or degrading the diffusion bond between target and backing plate. The method comprises precipitation hardening the backing plate by heat treatment that includes quenching the diffusion bonded sputtering target assembly by the process includes heating, working, and quenching and the quenching is performed after diffusion bonding by immersing the sputtering target assembly in a quenchant to immerse the backing plate without submerging the sputtering target. The sputtering target assembly may be subjected to a plurality of precipitation hardening treatments that include heating and partial-immersion quenching, as described, to provide a desired temper in the backing plate. In a preferred embodiment, the backing plate comprises a heat treatable aluminum alloy of the 2000, 6000 or 7000 series and the sputtering target comprises aluminum, titanium, or nickel, titanium-tungsten, tungsten, cobalt and tantalum and alloys thereof. The sputtering target assembly of the invention comprises a precipitation hardened backing plate diffusion bonded to a sputtering target.

BRIEF DESCRIPTION OF DRAWINGS

The accompanying photomicrographs compare the interface of a tantalum to aluminum diffusion bond without nickel, FIG. 1A, and the interface of a tantalum and aluminum diffusion bond after incorporating a Ni-plating between the tantalum and aluminum prior to diffusion bonding, FIG. 1B.

DETAILED DESCRIPTION

A problem encountered in producing diffusion bonded sputtering target assemblies is difficulty in producing a sputtering target assembly having a precipitation hardened backing plate, e.g. a backing plate in the fully hardened condition. For example, diffusion bonded sputtering target assemblies may be produced with the flange in an annealed, e.g. fully annealed, condition or in a condition below the desired degree of hardening, with the result that optimal mechanical strength of the sputtering target assembly is not developed and the assembly may be deformed during service. An example of a sputtering target assembly system particularly vulnerable to this problem is an assembly with an aluminum alloy backing plate which softens upon exposure to elevated temperature encountered during the diffusion bonding process. Although aluminum alloys are capable of being heat treated to achieve high strength, such as by heat treating to the T6 hardened condition, such heat treatments include quenching steps that would render the diffusion bonded assembly vulnerable to delamination and/or other degradation of the diffusion bond.

To illustrate one embodiment of the invention, described below is an example of producing a diffusion bonded sputtering target assembly comprising a heat treatable aluminum alloy diffusion bonded to a sputtering target. A heat treatable material, e.g. aluminum alloy, is defined as a material containing constituents that have increased solubility at elevated temperatures, with restricted solubility at lower temperature. Although this example is of a heat treatable aluminum alloy, it is apparent that the process may be usefully applied to backing plates of other precipitation hardenable materials such as alloys of titanium, copper, or aluminum (e.g. Ti alloys, Cu alloys, Al alloys). Similarly, various target materials may be employed, such as titanium, aluminum, nickel, tungsten, titanium-tungsten, tantalum, cobalt, and alloys thereof. Typically, diffusion bonded titanium targets are produced by bonding aluminum or aluminum alloy backing plates in a fully annealed condition to a target. The diffusion bond is created by heating to elevated temperatures in excess of about 300° C. which is sufficiently high to bring the aluminum or aluminum alloy backing plate into a dead soft state. However, by the method of the invention the sputtering target assembly is processed to bring the backing plate into a hardened condition. In the case of aluminum alloys, for example, commercially heat treatable aluminum alloys, such as alloys of aluminum in the 2000, 6000 and 7000 series, can be processed to produce high strength but without causing target deformation in the sputtering target assembly or delamination during use.

Figure 1A:
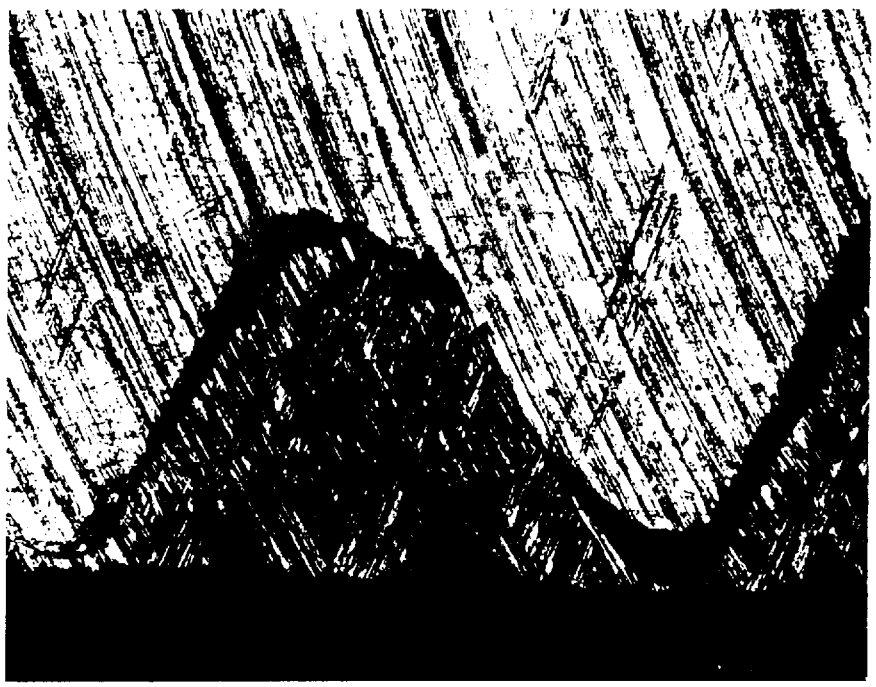
Figure 1B:

The microphotographs in FIGS. 1A and 1B show the interface at 50× of ta: Al diffusion bond with no nickel (FIG. 1A) and the diffusion bond interface of ta: Al with nickel at 200×.

In one example, a sputtering target assembly is made using as a backing plate heat treatable aluminum alloy-6061. This commercial alloy has a purity of typically about 99.0 to 99.9 wt. % with the primary alloy constituents comprising silicon, about 0.4 to 0.8 wt. %, magnesium about 0.8 to 1.2 wt. %, and iron about 0.7 wt. %. The primary strengthening precipitate in a 6000 series aluminum is $Mg_2Si$.

Advantageously, a two-stage heat treatment is used, including a solution treatment followed by a secondary artificial aging step to allow control over the precipitation of the $Mg_2Si$, thus promoting increased mechanical properties. Generally, precipitation strengthening of super saturated solid solution involves the formation of finely dispersed precipitates during aging heat treatments. An important aspect of both solution treatment, i.e., obtaining a super saturated solid solution, and the artificial aging heat treatment is quenching.

Precipitation hardening, also referred to as age hardening, involves precipitation of second phase from a super saturated solid solution. The precipitates impede movement of dislocations which makes the alloy stronger and less ductile. In order for an alloy to be precipitation hardenable, it must display partial solid solubility and decreasing solid solubility with decreasing temperatures. Precipitation hardening comprises dissolving, or "solutioning", which requires heating above this solvus temperature in order to form a homogenous solid solution, and quenching rapidly to room temperature to retain a maximum amount of alloying elements in solid solution followed by an aging step, i.e., heating the alloy below the solvus to permit precipitation of fine particles of a second phase. The solvus represents the boundary on a phase diagram between the solid-solution region and a region comprising a second phase in addition to the solid solution. During heat treatment of these alloys a controlled dispersion of submicroscopic particles is formed in the microstructure and the final properties of the alloy depend upon how the particles are dispersed and upon their size and stability.

A diffusion bonded target assembly often combines materials of different Coefficient of Thermal Expansion (CTE). Rapid cooling of such a system could cause partial distortion and separation of the bonded materials. By practicing the process of the invention, diffusion bonding is combined with heat treatment to produce a backing plate with the desired temper e.g. T6 temper in AL-6061. This accommodates the mismatch of the Coefficient of Thermal Expansion of the target and backing plate and avoids bond failure.

As an example, material to be used as the sputtering target is provided and prepared for diffusion bonding by cleaning the surface to be bonded to the backing plate. The surface may be prepared by machining one continuous channel creating a spiral pattern on the surface to be bonded followed by grit blasting and chemical cleaning. The material to be used as the backing plate, e.g. as cast homogenized aluminum 6061 billet or alternate heat treatable alloy, or work hardened material, is cut to length (based on desired target configuration ending volume and overall dimension) preheated to a temperature sufficient to decrease the flow stress, hot forged with forge platens at room temperature or elevated to the same temperature as the part to be forged, and quenched by full submersion into quenchant, e.g. water, to produce a work hardened AL-6061 alloy backing plate. The backing plate is then annealed to remove work hardening effects of forging and the surface of the backing plate to be bonded to the target is then prepared and cleaned, e.g. by machining, milling or turning on a lathe. The target and backing plate are assembled by mating the described prepared surfaces and diffusion bonded by first preheating the assembly to a temperature sufficient to decrease the flow stress of the backing plate and promote full intimate contact of the prepared surfaces during the forging step, and hot forging. The forge platens may once again be heated to an elevated temperature and a pressure of about 20,000 psi to 35,000 psi is applied to the target/backing plate assembly to allow full contact of mated bond surfaces. The forged assembly is then heat treated by placing the assembly directly into a preheated furnace. The heat treatment is designed to produce a desired temper, e.g. T6 for alloy 6061, to harden and strengthen the backing plate material. The heat treatment comprises solution treating the backing plate by heating the diffusion bonded sputtering target assembly to a temperature of at least about 985° F., holding the assembly at a temperature for a time sufficient to dissolve the second phase into solution, and then quenching. The heat treated sputtering target assembly is quenched by partially immersing the assembly in a quenchant, e.g. water, so that the backing plate is submerged without submerging the target. By quenching in this manner the backing plate acts as a heat sink to remove heat from the target and maintains the integrity of the diffusion bond.

The quenched diffusion bonded sputtering target assembly may then be machined and flattened after which it can be artificially aged to precipitation harden the backing plate to a hardened tempered condition, e.g. by heating to temperature and holding a sufficient time to precipitate the second phase in the aluminum matrix followed by partially-immersed quenching as described above by immersing in the quenchant to submerge the backing plate without submerging the target. The resulting sputtering target assembly comprises a precipitation hardened backing plate, such as Al 6061, having the desired temper, e.g. T6, diffusion bonded to the target. It is evident that the process may be adjusted to produce a backing plate of any desired temper, e.g. 0, $T_4$, etc., but without adversely affecting the diffusion bond between the target and backing plate.

The shear strength for a diffusion bonded sputtering target assembly made with non-heat treatable aluminum alloy is generally in the range of about 12,000 psi to 20,000 psi with the average being toward a value of 16,000 psi. A sputtering target assembly of aluminum alloy 6061-T6 has a bond shear strength in the range of about 22,000 to 23,000 psi at room temperature and about 17,700 psi at 392° F. As indicated previously, the process is also capable of producing sputtering target assemblies having backing plates with other temper properties, e.g. T4, as well. The following are mechanical and physical properties of particular sputtering target assemblies:

A. Shear Strength, Titanium to Aluminum bond strength. 70° F. (21° C.): 23 Ksi to 23 Ksi (151 MPa to 158 MPa) 392° F. (200° C.): 17.7 Ksi (122 MPa)

B. Ultimate Tensile Strength of backing plate. 70° F. (21° C.): 45 Ksi (310 MPa)

C. Yield Strength, the Elastic Limit. 70° F. (21° C.): 36 Ksi (248 Mpa)

D. Hardness of the finished backing plate: 100–109 HBW.

E. Titanium grain structure is unaltered by the diffusion bonding and 6061-T6 processing steps.

For comparison purposes, the following are 6061 commercial aluminum alloy

Temper designations used to identify thermally enhanced mechanical properties:

"T6", typical commercial properties: Ultimate Tensile Strength of 45ksi (310 MPa) Hardness of 95 HBW (Brinell Number)

"T4", typical commercial properties: Ultimate Tensile Strength of 35ksi (241 Mpa). Hardness of 65 HBW.

Mechanical properties are typically measured by tensile testing in conformance with ASTM E8-89b or ASTM B557-94. Hardness is measured in Brinell Number-HB, 500 Kg load, 10 mm ball in conformance to ASTME 10-93.

Sputtering target assemblies with 6061 aluminum is presently preferred in the T6 temper condition which produces a typical ultimate tensile stress of about 45ksi (310 Mpa) in a hardness of about 95 Brinell Number.

The process described above combines a diffusion bonding with a two-stage heat treatment found to be desirable to generate T6 properties. Tempering of 6061 aluminum involves an initial solution treatment followed by a secondary artificial aging step. The two-step heat treating controls the precipitation of $Mg_2$ Si to promote an increase in strength. A general requirement for precipitation strengthening of super saturated solid solution involves formation of finally dispersed precipitates during aging heat treatments. The particularly described quenching technique is very important to achieve the desired mechanical properties without adversely affecting the diffusion bond of the target to the backing plate. Commercial grade aluminum 6061 can be purchased in the T6 condition and annealed to a 0 temper for subsequent processing, or work hardened material can be used as the backing plate starting material. Table 1 below compares the properties of sputtering target assemblies produced by three different methods identified in the table as Ti-6061-1, -2, and -3. The first target is produced by standard diffusion bonding practices described above followed by artificial age hardening and water quenching. The second assembly is produced by diffusion bonding and includes solution treatment of alloy 6061 followed by a water quench and then a secondary artificial age hardening with a full water quench. The third process is by diffusion bonding the assembly, solution treatment of the alloy 6061 followed by a partial immersed water quench, then performing secondary artificial age hardening and again followed by a partial immersed water quench. All three samples were processed through Ultrasound Bondline Scan practices and then sectioned in half for macro examination of the bondline. Samples were taken for shear testing, hardness and metallography.

TABLE 1

Phase One, half scale target evaluation data

| Target | C-Scan | Hardness, HB | Shear Strength, psi |
|---|---|---|---|
| Ti-6061-1 | 100% | 42.4 | 15,150 |
| Ti-6061-2 | 99% | 109 | 17,615 |
| Ti-6061-3 | 99% | 100 | 19,021 |

No delamination of target and backing plate was noted during processing which was confirmed by metallography. The process for Ti-6061-2 also produced acceptable results, however, upon evaluation of shear strength values and bondline metallurgy implies the full quench may create a negative impact on bondline integrity, but may be employed where target and backing plate material form adequate intermetallic bonding.

Table 2 reports results of examples of full scale titanium blank used in conjunction with an alloy 6061 backing plate to produce a diffusion bonded target. The practice previously described for material surface preparation of the target and backing plate and the processing described above for the Ti-6061-3 assembly was used. Shear samples were prepared and analyzed for conformance to MIL-J-24445A(SH), Triple Lug configuration. The results of shear testing are shown in Table 2.

TABLE 2

Phase Two Shear Strength, Triple Lug Shear testing performed at room temperature and 200° C.

| Feb. 9, 1998 Sample | Lug | Temp. (° C.) | Load, lbs. | Shear Stress, psi | Average |
|---|---|---|---|---|---|
| 1 | A | 21 | 4657 | 24,739 | 23,535 |
|   | B | 21 | 3432 | 19,124 |   |
|   | C | 21 | 4916 | 26,744 |   |
| 2 | A | 21 | 3830 | 21,681 | 22,678 |
|   | B | 21 | 3872 | 20,879 |   |
|   | C | 21 | 4703 | 25,472 |   |
| 3 | A | 200 | 2778 | 15,309 | 17,727 |
|   | B | 200 | 3472 | 18,622 |   |
|   | C | 200 | 3474 | 19,251 |   |

The average diffusion bond Shear Stress at room temperature is in the range of about 22.6 to 23.5 ksi. Elevated temperature testing at 200° C. showed a value of about 17.7 ksi, both of which exceed the nominal Shear Stress of standard backing plate materials when tested at room temperature.

Metallography examination showed no significant loss of diffusion bonding due to change in chemistry or metallurgy of the 6061 aluminum as compared with non-precipitation hardenable aluminum alloy backing plates. After flattening and machining, scanning of the target in a T6 condition and rough machined condition showed a 99.99% bonded area. The results of mechanical testing are shown in Table 3 below. Tensile testing coupons and methods were conducted under ASTM E8 and B557 standards. Estimates of Young's Modulous were measured from stress/strain curves of the tensile test as outlined in ASTM E111-82 and hardness testing was performed per ASTM E10-93. The results in Table 3 compare titanium diffusion bonded targets to 6061-T6 Aluminum backing plate target, 6061 Aluminum in the 0 temper, and an aluminum alloy backing plate containing 1% Si and 0.5% Cu taken from a typical diffusion bonded target. The 6061 backing plate meets typical industry standards for 6061 in the T6 condition.

TABLE 3

Phase Two mechanical data compared to published values of 6061 and alternate backing plate aluminum alloy

| Material | Source | Ultimate Stress, ksi | Yield Stress, si | Elong., % (½" dia. sample) | Modulous, ×10$^6$ psi | Hardness, RB |
|---|---|---|---|---|---|---|
| 6061-T6 | Published | 45.0 | 40.0 | 17.00 | 10.00 | 95 |
| 6061-0 | Raw Material | 20.8 | 7.7 | 24.33 | 10.03 | 38 |
| 6061-T6 | Diffusion Bonded T6 | 43.8 | 41.5 | 11.00 | 10.90 | 96 |
| Al + 1% Si + 0.5% Cu | Alternate Al Alloy | 15.7 | 7.0 | 39.33 | 4.77 | 29 |

A preferred embodiment to manufacture a sputtering target assembly with a precipitation hardenable backing plate diffusion bonded to a sputtering target is illustrated below by the process described for producing an Aluminum 6061 Alloy backing plate diffusion bonded to a titanium sputtering target.

Continuously cast 6061 homogenized billet is cut to specified lengths corresponding to the final dimensions of the target to be diffusion bonded. The diameter of the billet can be in the range of about seven to twelve inches.

The 6061 billet is pre-heated to 572° F. and allowed to sustain temperature for about twenty to thirty minutes. The billet is then forged to a designated height and quenched. The forge used for this application is advantageously capable of a minimum of about 10,000 psi applied pressure and fashioned with a heated platen for isothermal condition. The forge rate is in the range of about five to ten inches per minute. The result is a backing plate in a roughed condition.

The backing plate is then annealed to remove any effects of working in the backing plate manufacturing step by heating the plate to a temperature of about 775° F. for a minimum of three hours. After the three hour soak at 775° F., the temperature is reduced 500° F. at a rate of about 50° F. per hour. Upon reaching temperature of 500° F., it is allowed to cool in air to room temperature.

The target and backing plate are diffusion bonded after the surfaces to be bonded have been prepared and cleaned. For example, the target surface can be prepared and cleaned by machining one continuous threaded channel on the surface, grit blasting the surface, and chemically cleaning the surface. The surface of the backing material can be cleaned by machining, milling or turning on a lathe. The backing plate and target is diffusion bonded by preheating to a temperature sufficient for adequate material flow and hot forged.

After diffusion bonding, the diffusion bonded assembly is solution heat-treated for about three hours at 985° F. to achieve to achieve a T4 condition. The time at temperature is determined by the target thickness, three hours being typical for a low profile target. The time is selected by applying 65 minutes for the first ½inch and 30 minutes for each additional ½inch increment. The diffusion bonded sputtering target assembly is quenched in a quenchant, e.g. a water tank, held at a temperature range of approximately 50° F. to 72° F. To avoid delamination of the target from the backing plate, the assembly is only partially submerged in the quenchant, that is, the backing plate is immersed in the quenchant without submerging the target. Typically, the water is held to a maximum of about ½to inch from the top surface of the target phase and the assembly is allowed to cool.

The target is then cut to a suitable rough diameter for further processing. It is possible that at this stage the diffusion bonded assembly may be bowed or distorted, and if so, the target will be high in the center. Such visual condition is corrected prior to final heat treatment by flattening using a hydraulic press, such as a 100 ton capacity press or greater. Tool steel plates may be placed over the target surface and the entire plate/assembly unit placed on a tool steel ring sized to the outer diameter of the target to allow for a plastic deformation that counters the bowed surface.

The flattened assembly is artificially aged by heating at least 350° F. for eight hours in an air furnace. The diffusion bonded sputtering target assembly is then quenched by the partial immersion quenching method described above. The result of the process described is a sputtering target assembly in the T6 condition which can then be submitted to final machining.

It has also been discovered that by incorporating a nickel layer between the target and backing plate the diffusion bond between the target and backing plate is enhanced. For example, tantalum and aluminum have limited to negligible solid solubility into one another which makes it extremely difficult to form an optimum diffusion bond between a tantalum target and an aluminum or aluminum alloy backing plate. An intermediate layer of nickel promotes diffusion between tantalum and nickel and between nickel and aluminum. An optimum diffusion bond cannot be achieved without the intermediate nickel layer.

The photomicrographs of FIGS. 1A and 1B, previously discussed, compare the interface of a tantalum to aluminum diffusion bond without nickel and the diffusion bond interface between tantalum and aluminum after incorporating a Ni-plating between the tantalum and aluminum prior to diffusion bonding. The results are dramatic.

Figure 2:
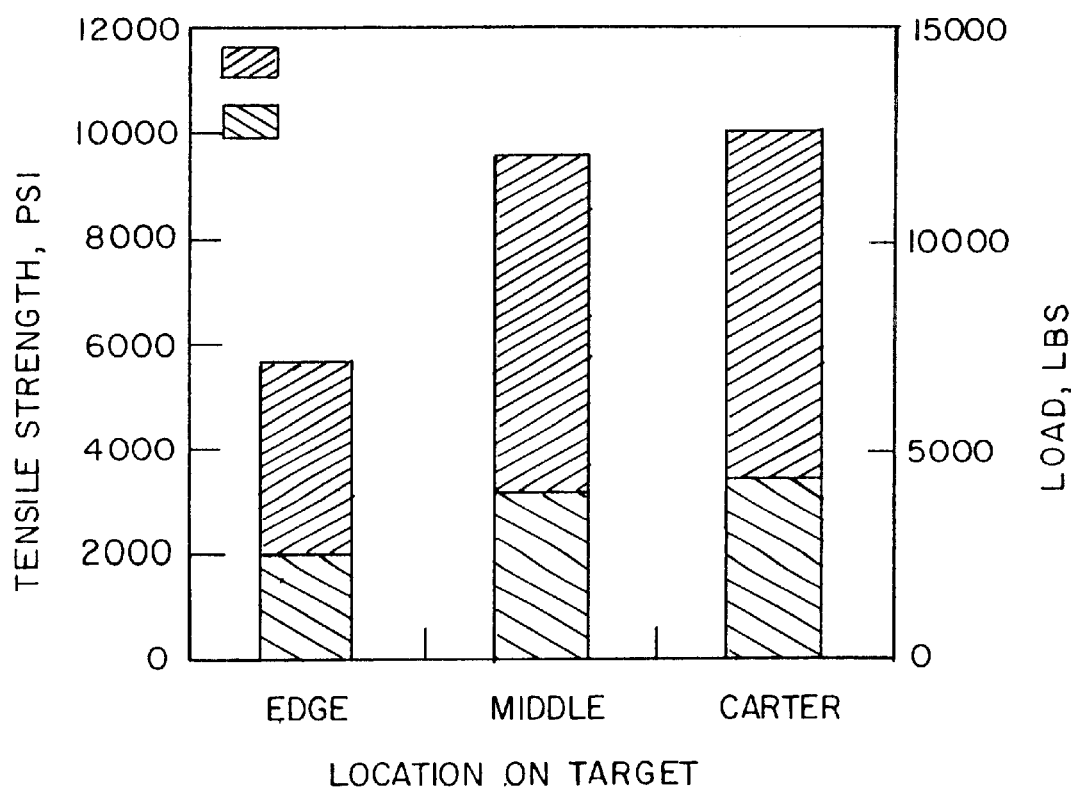
FIG. 2 is a graph showing tensile strength at different locations on a target.

To further show this effect, reference is made to FIG. 2 which is a graph illustrating the tensile strength and location on a target with respect to UT stress and UT look. These results are summarized in Table 4 below.

TABLE 4

| TENSILE STRENGTH | | |
|---|---|---|
| LOCATION | UT LOAD | UT STRESS |
| Edge | 2,500 | 5,680 |
| Middle | 3,970 | 9,610 |
| Center | 4,350 | 10,050 |

A diffusion bonded target with a nickel interface between the target and the backing plate may be made by the following process:

A. The surface of the target to be diffusion bonded is scrolled, such as by use of one continuous about 0.015" deep scroll.

B. The scrolled surface is then Ni-plated by a process which includes
1. bead blasting the surface to be plated,
2. electro-cleaning the surface in a alkaline cleaning solution at a temperature of about 150° F. for about 75 amp-min.,
3. etching the surface to be plated in a solution of 60% $H_2SO_4$, 20% HF and 20% deionized $H_2O$,
4. Plating the target with Ni for 500 amp-min. in a "Barrette Nickel Sulphamate Strike Bath" with a pH of about 1.3 and temperature of about 105° F. with the target rotated 180° after 250 amp-min. and the process repeated,
5. Rinsing the target with deionized water between each of steps 1 to 4, and
6. Drying the after the last rinse, C. Vacuum annealing the Ni-plated target to allow for diffusion to occur between the nickel and the target. For example, for a tantalum target the vacuum annealing may be performed at about 825° C. to achieve diffusion.

D. After vacuum annealing the target is then diffusion bonded to a high strength backing plate such as aluminum alloy 6061-T6. Advantageously, the backing plate comprises a heat-treatable aluminum alloy of the 2000, 6000 or 7000 series and the sputtering target comprises at least one of tantalum, cobalt, copper, tungsten, titanium, titanium-tungsten, and alloys thereof.

It is apparent from the foregoing that various changes and modifications may be made without departing from the invention.

Accordingly, the scope of the invention should be limited only by the appended claims wherein what is claimed is:

1. A sputtering target assembly comprising a precipitation hardened backing plate diffusion bonded to a sputtering target having a coefficient of thermal expansion different from the backing plate, the assembly having a Ni-comprising material between the backing plate and the sputtering target.

2. A sputtering target assembly according to claim 1 wherein the backing plate comprises a heat treatable alloy of titanium, aluminum, or copper.

3. A sputtering target assembly according to claim 1 wherein the backing plate comprises an aluminum alloy of the 2000, 6000, or 7000 series.

4. A sputtering target assembly according to claim 1 wherein the sputtering target comprises aluminum, tungsten, nickel, titanium, titanium-tungsten, tantalum, cobalt, or alloys thereof.

5. A sputtering target assembly according to claim 1 wherein the sputtering target comprises a scrolled surface and the Ni-comprising material contacts the scrolled surface.

6. A sputtering target assembly according to claim 1 wherein the Ni-comprising material comprises plated Ni and is on the sputtering target.

7. A sputtering target assembly according to claim 1 wherein the Ni-comprising material comprises vacuum annealed Ni.

8. A sputtering target assembly comprising a precipitation hardened backing plate diffusion bonded to a sputtering target having a coefficient of thermal expansion different from the backing plate, the assembly having vacuum annealed Ni plated on the sputtering target between the backing plate and the sputtering target.

9. A sputtering target assembly comprising a precipitation hardened backing plate diffusion bonded to a sputtering target, the assembly having a Ni-comprising material between the backing plate and the sputtering target, wherein the backing plate comprises aluminum or an aluminum alloy and exhibits a hardened temper comprising O, T4, or T6.

10. A sputtering target assembly according to claim 9 wherein the backing plate exhibits a T6 temper.

11. A sputtering target assembly according to claim 9 wherein the backing plate consists of aluminum or an aluminum alloy.

* * * * *

UNITED STATES PATENT AND TRADEMARK OFFICE
CERTIFICATE OF CORRECTION

PATENT NO. : 6,555,250 B2
DATED : April 29, 2003
INVENTOR(S) : Ritesh P. Shah et al.

It is certified that error appears in the above-identified patent and that said Letters Patent is hereby corrected as shown below:

Column 4,
Line 57, replace "Ksi (248 Mpa)" with -- Ksi (248 MPa) --

Column 5,
Line 2, replace "Strength of 35ksi (241 Mpa). Hardness of" with -- Strength of 35 ksi (241 MPa). Hardness of --
Line 9, please replace "ultimate tensile stress of about 45 ksi (310 Mpa)" with -- ultimate tensile stress of about 45 ksi (310 MPa) --

Column 6,
Line 50, please replace "RB" with -- HB --

Column 7,
Line 29, please replace "achieve to achieve a T4 condition." with -- achieve a T4 condition --
Line 40, please replace "water is held to a maximum of about 1/2 to inch" with -- water is held to a maximum of about 1/2 inch --

Column 8,
Line 47, please replace "6. Drying the after the last rinse," with -- 6. Drying the target after the last rinse. --

Signed and Sealed this

Fifth Day of April, 2005

JON W. DUDAS
*Director of the United States Patent and Trademark Office*